United States Patent [19]

Reitz

[11] 4,115,625

[45] Sep. 19, 1978

[54] SODIUM THALLIUM TYPE CRYSTAL ON CRYSTALLINE LAYER

[75] Inventor: Norman E. Reitz, Redwood City, Calif.

[73] Assignee: Sotec Corporation, Redwood City, Calif.

[21] Appl. No.: 789,566

[22] Filed: Apr. 21, 1977

Related U.S. Application Data

[62] Division of Ser. No. 737,389, Nov. 1, 1976, Pat. No. 4,042,447.

[51] Int. Cl.$^2$ ................... B32B 15/00; B32B 15/20
[52] U.S. Cl. .................. 428/641; 136/89 SG; 357/4; 357/30; 428/642; 428/674
[58] Field of Search ............ 428/620, 615, 641, 642, 428/674, 450, 973; 252/501, 512; 75/134 A, 134 T; 136/89 TF, 89 SG; 357/4, 30

[56] References Cited

U.S. PATENT DOCUMENTS

| | | | |
|---|---|---|---|
| 3,325,392 | 6/1967 | Rummel | 156/610 |
| 3,370,980 | 2/1968 | Anderson | 156/610 |
| 3,382,099 | 5/1968 | Montmory | 156/613 |
| 3,417,301 | 12/1968 | Galli et al. | 357/4 |
| 3,515,576 | 6/1970 | Manasevit | 156/613 |
| 3,563,730 | 2/1971 | Bach et al. | 75/134 A |
| 3,658,586 | 4/1972 | Wang | 156/613 |
| 3,957,532 | 5/1976 | Settle et al. | 75/134 A |
| 3,990,914 | 11/1976 | Weinstein et al. | 156/610 |
| 3,993,533 | 11/1976 | Milnes et al. | 156/613 |
| 4,011,372 | 3/1977 | Tomczwk et al. | 75/134 A |

OTHER PUBLICATIONS

Schone, et al.; Acta Metallurgica, vol. 11, Mar. 1963, pp. 179-186.
Barrett, C. S. et al.; Structure of Metals, third edition, McGraw Hill, N. Y. pp. 626-631, (1966).
Sze, Physics of Semiconductors, John Wiley & Sons, pp. 11-17 (1969).
Bertoti, Journal of Material Science, 5(12), pp. 1073-1077 (1970).

Primary Examiner—L. Dewayne Rutledge
Assistant Examiner—Michael L. Lewis
Attorney, Agent, or Firm—Phillips, Moore, Weissenberger, Lempio & Majestic

[57] ABSTRACT

Relates to a composition of matter comprising a conductive sodium thallium type crystalline alloy substrate of LiZn, LiAl, LiGa, LiIn, NaTl or LiCd having crystalline silicon integrally overgrown thereon in an oriented crystal layer. Solar cells and semi-conductors can be formed from the product.

10 Claims, No Drawings

SODIUM THALLIUM TYPE CRYSTAL ON CRYSTALLINE LAYER

This is a division of Ser. No. 737,389, filed Nov. 1, 1976 now U.S. Pat. No. 4,042,447 issued Aug. 16, 1977.

BACKGROUND OF THE INVENTION

1. Field of the Invention

This invention relates to a layer of crystalline silicon and, more particularly, relates to a layer of crystalline silicon oriented on a sodium thallium type (dual diamond) crystalline substrate.

2. Prior Art

One of the primary limitations in reducing the cost of solar cells for terrestrial applications is the utilization of a manufacturing sequence which requires the production of highly pure semiconductor grade polycrystalline silicon, the growth of crystal silicon in bulk, typically in the form of cylindrical ingots, and the sawing of these ingots into discrete slices. By the time the actual solar cell processing occurs, i.e., the formation of a p-n junction and application of electrical contracts, the greatest portion of the product cost has been incurred. This results from the fact that the manufacturing sequence described above results in considerable material loss at the sawing stage since the kerf or "sawdust" losses can amount to about 50% of the original ingot. Also, the thickness of the finished wafer, on the order of 200$\mu$m to 400$\mu$m, is many times the thickness actually required to produce a satisfactory solar cell. Additionally, not only is a great amount of material wasted or unused but the process itself is costly, time consuming, requires large amounts of energy and severely separates the beginning of the materials chain from the finished product.

The nucleation of semiconductor silicon material on suitable substrate material has been the objective of numerous research efforts. See e.g., T. L. Chu, et al, "Polycrystalline Silicon Solar Cells for Terrestrial Applications", 11th Photovoltaic Specialists Conference Report 1975, p. 303. The general approach has been to find a substrate material which is inexpensive, easy to handle, does not interfere electronically with the solar cell to be formed and is susceptible to incorporation in a continuous manufacturing operation. This approach has led to the selection of non-silicon substrates and of metallurgical silicon substrates. Glass, plastic and various metals have been considered as candidate substrates. The obstacles to date to the development of an acceptable method are the quality of the crystal produced and the rate of nucleation of silicon on the substrates. Only relatively low efficiencies on the other order of a few percent have been obtained with solar cells fabricated with thin film silicon material produced on such substrates. Ideally, one would want to be able to continuously produce a layer of crystalline silicon on a suitable substrate with a sufficiently high degree of crystalline perfection to produce a solar cell with an acceptable efficiency.

It is an object, therefore,, of the present invention to provide a layer of crystalline silicon on a substrate other than single crystal silicon.

It is an additional object of this invention to provide a layer of crystalline silicon which uses a surrogate crystalline substrate that simulates the crystal structure of silicon by achieving oriented crystal overgrowth of silicon on a crystalline substrate of the sodium thallium (dual diamond) type.

It is a further object of the invention to provide a layer of crystalline silicon integral with a conductive alloy.

SUMMARY OF THE INVENTION

A composition of matter comprising a conductive sodium thallium type crystalline alloy substrate selected from the group consisting of LiZn, LiAl, LiGa, LiIn, NaTl and LiCd having crystalline silicon integrally overgrown thereon in an oriented crystal layer.

DESCRIPTION OF THE PREFERRED EMBODIMENT

Crystalline silicon forms a diamond structure. Each atom lies at the center of a tetrahedron; the tetrahedral spacing from the center to any apex of the tetrahedron is 1.17Å; the lattice constant is 5.4Å. Nearly perfect crystals can be produced from the melt at a temperature in excess of 1420° C. The Czochralzki process is widely used to produce high quality crystalline silicon for semiconductor device fabrication. Also, good quality crystalline silicon may be epitaxially produced on surfaces of semiconductor grade single crystal silicon by vapor deposition, sputtering or evaporation techniques. Generally, only relatively imperfect crystalline silicon has been produced on metallurgical grade crystalline silicon or on non-silicon substrates; an exception is silicon on sapphire discussed subsequently.

The formation mechanism for epitaxial growth is not completely understood. It is believed that the silicon atoms rearrange themselves in a minimum energy configuration. It is further believed that growth occurs in the direction of an uninterrupted chain of strong bonds between the building blocks (a periodic bond chain). See "Structure and morphlogy" Crystal Growth; an introduction, p. 373 (1973). Such growth is possible when a high quality crystalline surface is presented of the type of the applied atom. The surface, in effect, serves as a template. Crystal order and dimension are crucial while chemical compatability is of secondary importance. Growth is impeded when physical defects, called dislocations, are present at or near the surface of the crystalline substrate.

Successful formation of crystalline silicon is possible on a substrate of semiconductor grade crystalline silicon when atoms of silicon are applied to the surface of the substrate with sufficient thermal energy and thus sufficient surface mobility to find a periodic bond chain position. Well known techniques include vapor deposition, sputtering or thermal evaporation. Formation of a layer of crystalline silicon on metallurgical silicon is not successful due to contamination and physical defects. Formation of a layer of crystalline silicon on non-crystalline material generally results in imperfect nucleation. Formation of a layer of crystalline silicon on non-silicon crystalline substrates has been successful in certain cases such as on sapphire or α-alumina (silicon on sapphire) and on spinel (Al$_2$O$_3$ . MgO); however, silicon produced on such insultating substrates is not suitable for solar cell fabrication unless the insulting substrate is removed, a highly impracticable step for economic processing, since elctronic contact must be made both surfaces of the silicon.

The method of the present invention is based upon the use of a sodium thallium (dual diamond) type surrogate crystalline silicon. The surrogate substrate provide., in essence, a template for the overgrowth of a layer of crystalline silicon, often as a single crystal. Sodium thallium is an alloy which forms a type of crystal structure which is a marvel of nature. It can be formed, e.g., as taught by M. Sittig, "Alloy Formation" in Sodium, Its Manufacture, Properties and Uses, ACS Publication pp. 51–89 (1956). It forms a cubic face-centered lattice in which the constituent metal atoms, when considered alone, form a dual interleaved diamond structure (dual diamond). The sodium atoms, considered by themselves, form a diamond structure and the thallium atoms, considered by themselves form a diamond structure; the structure in each case is that of crystalline silicon. The combined structure has the characteristic that the distance between neighboring sodium and thallium atoms is constant. As a result, the tetrahedral distances (from the center to any apex) in the individual diamond structures are also the same. This constancy is only possible if the atomic radius of the more electropositive metal, i.e., Na., is sharply reduced while that of the more electronegative metal, i.e., Tl, remains only slightly changed. This is the situation found experimentally. See W. Huckel, "Structural Chemistry of Inorganic Compounds", Vol. II, pp. 829–831. In the art, such structures are referred to as "NaTl-type" or sodium thallium type even though many crystals having such structures have neither sodium nor thallium as constituents. Based on this phenomena the tetrahedral distances for a number of the NaTl-type alloys have been calculated and are given in Table 1.

Table 1*

| Alloy First Metal | Alloy Second Metal | Tetrahedral Spacing | Relation to Silicon Spacing | First Metal Electronegativity | Second Metal Electronegativity |
|---|---|---|---|---|---|
| | LiZn | 1.23A° | + 5.1% | 1.0 | 1.6 |
| | LiAl | 1.26A° | + 7.6% | 1.0 | 1.5 |
| | LiGa | 1.26A° | + 7.6% | 1.0 | 1.6 |
| | LiCd | 1.34A° | +14.5% | 1.0 | 1.7 |
| | LiIn | 1.40A° | +19.0% | 1.0 | 1.7 |
| | NaTl | 1.51A° | +29.0% | .9 | 1.8 |

*These values obtained by calculation based on the atomic radii of the constituent elements and the solid geometrical relationships of the dual interleaved diamond structure within the face-centered cubic lattice. The values agree within 10% with (and the trend is confirmed by) ancient X-ray data reported by E. Zintl, et al, Z physik, Chem. 20B, pp. 245–271, 1933.

All of the alloys of this type possess the dual interleaved diamond structure and can potentially serve as surrogate substrates for the nucleation of crystalline silicon. It can be seen that the diamond lattices of the constituent atoms of the NaTl type face-centered cubic crystals are all larger than the lattice for single crystal silicon. This permits them to serve as a template providing the mismatch is not too great. While matches of within about 30% in tetrahedral distances are contemplated as being useful, the preferred match is within 15% bringing LiZn, LiAl, LiGa and LiCd within the preferred range.

The successful nucleation of crystalline silicon on a sodium thallium type substrate depends upon the match between the lattice spacing, as set out above, and upon the Pauling electronegativity of the atom in the sodium-thallium type crystal which will form the surrogate substrate. Silicon will have a greater affinity for sites at which an atom with a close electronegativity would have nucleated. As can be seen from Table 1, the electronegativities of the heavier (second) elements range from 1.5 to 1.3. These are close enough to silicon (1.8) to provide an affinity at those sites where these heavy atoms would have nucleated.

Crystalline alloys of the sodium thallium type are electrical conductors. They are therefore capable of serving as the backside electrical contact to a layer of silicon which is incorporated into a functioning solar cell. Thus, as contrasted to the practice of growing silicon on insulating substrates — desirable for semiconductor device fabrication — the method of the present invention establishes a practice of growing silicon on conducting substrates — a desirable practice for solar cell production. Further, the resulting silicon-sodium thallium type cell is generally integrally formed and thus exhibits reproducible and consistent electrical and physical properties.

The method of the present invention consists of applying atoms of silicon to a substrate of the sodium thallium type. The atoms must be applied with sufficient thermal energy to allow them to arrange themselves, generally in a single crystal form or at times as polycrystalline silicon, by oriented crystal overgrowth on the substrate. The sodium thallium alloy itself can be formed from a melt with subsequent deposition by sputtering or evaporation onto a suitable backing. If the layer of crystalline silicon is to be directly formed into a solar cell, then sheet copper or another conductive sheet metal is a suitable backing. Application of the silicon atoms can be by conventional techniques such as deposition from the gas phase, i.e., $SiCl_4$ and $H_2$ gas epitaxy at a temperature of 1100° C., vacuum deposition, sputtering or evaporation. To further assist the formation of an overgrowth of crystalline silicon, in one embodiment, the sodium thallium type substrate is provided with thermal energy as by heating it; this provides impinging atoms with additional thermal energy to assist them in locating nucleation sites. The actual conditions of application will depend upon the technique and upon the particular substrate employed. It should be noted that several of the alloys contain elements which are effective dopants, i.e., acceptors, for the silicon material so care should be taken to undertake processing under conditions which do not cause the alloy to break down and release these elements.

The description herein has been made in terms of a crystal of the NaTl type, i.e., a dual interleaved diamond structure. It is the structure of the crystal and its dimensions rather than chemical properties that permit oriented crystalline overgrowth. Therefore, any other alloys having this crystal structure (isomorphs) other than those specifically enumerated are within the scope of this invention as defined above and in the following claims.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A composition of matter comprising a conductive sodium thallium type crystalline alloy substrate having crystalline silicon integrally overgrown thereon in an oriented crystal layer, said substrate being selected from the group consisting of LiZn, LiAl, LiGa, LiIn, NaTl and LiCd.

2. A composition of matter as in claim 1, wherein a tetrahedral center-apex distance of said sodium thallium type substrate is within about 30% of a tetrahedral center-apex distance of said crystalline silicon.

3. A composition of matter as in claim 1, wherein a tetahedral center-apex distance of said sodium thallium type substrate is within about 15% of a tetrahedral center-apex distance of said crystalline silicon.

4. A composition of matter as in claim 1, wherein said substrate comprises LiZn.

5. A composition of matter as in claim 1, wherein said substrate comprises LiAl.

6. A composition of matter as in claim 1, wherein said substrate comprises LiGa.

7. A composition of matter as in claim 1, wherein said subsrate comprises LiIn.

8. A composition of matter as in claim 1, wherein said substrate comprises LiCd.

9. A composition of matter as in claim 1, wherein said substrate comprises NaTl.

10. A composition of matter as in claim 1, including: a conductive base integral with said substrate.

* * * * *